(12) United States Patent
Weems et al.

(10) Patent No.: US 11,737,238 B1
(45) Date of Patent: Aug. 22, 2023

(54) DATA CENTER COOLING SYSTEM

(71) Applicant: UIPCO, LLC, San Antonio, TX (US)

(72) Inventors: John Andrew Weems, San Antonio, TX (US); Raymond F. Martin, San Antonio, TX (US)

(73) Assignee: United Services Automobile Association (USAA), San Antonio, TX (US)

( * ) Notice: Subject to any disclaimer, the term of this patent is extended or adjusted under 35 U.S.C. 154(b) by 50 days.

(21) Appl. No.: 17/549,605

(22) Filed: Dec. 13, 2021

Related U.S. Application Data

(63) Continuation-in-part of application No. 16/375,923, filed on Apr. 5, 2019, now Pat. No. 11,202,394.

(60) Provisional application No. 62/751,492, filed on Oct. 26, 2018.

(51) Int. Cl.
*H05K 7/20* (2006.01)

(52) U.S. Cl.
CPC ..... *H05K 7/20263* (2013.01); *H05K 7/20781* (2013.01)

(58) Field of Classification Search
CPC ............. H05K 7/20818; H05K 7/1488; H05K 7/20827
USPC ...................................................... 168/80.2
See application file for complete search history.

(56) References Cited

U.S. PATENT DOCUMENTS

| | | | |
|---|---|---|---|
| 6,747,872 B1 * | 6/2004 | Patel ..................... | G06F 1/206 62/263 |
| 7,397,661 B2 * | 7/2008 | Campbell .......... | H05K 7/20754 165/104.33 |
| 7,492,593 B2 * | 2/2009 | Campbell .......... | H05K 7/20754 165/104.33 |
| 7,969,727 B2 * | 6/2011 | Tozer ................. | H05K 7/20818 361/679.48 |
| 8,077,462 B2 * | 12/2011 | Barringer ........... | H05K 7/20818 361/698 |
| 8,113,009 B2 * | 2/2012 | Kuriyama ............. | F25B 47/006 361/696 |
| 8,300,402 B2 * | 10/2012 | Wei ..................... | H05K 7/20754 165/122 |
| 8,701,429 B2 * | 4/2014 | Oki ....................... | F24F 5/0035 62/181 |
| 8,955,347 B2 * | 2/2015 | Campbell .......... | H05K 7/20136 361/679.52 |

(Continued)

OTHER PUBLICATIONS

Restriction Requirement dated Apr. 23, 2021 in U.S. Appl. No. 16/375,923.

(Continued)

*Primary Examiner* — Jon T. Schermerhorn, Jr.
(74) *Attorney, Agent, or Firm* — Plumsea Law Group, LLC

(57) ABSTRACT

A cooling system configured to remove heat from a chimney of a server cabinet. The chimney has an extending portion extending above the server rack including a chimney heat exchanger in the extending portion above the server rack. The chimney heat exchanger has a fluid inlet for receiving a working fluid and a fluid outlet for discharging the working fluid. The chimney heat exchanger also has an upstream surface receiving warm waste heat generated by one or more servers and a downstream surface that discharges cooled air cooled by the chimney heat exchanger. The server rack may be accessed through the chimney without requiring movement of the chimney heat exchanger.

20 Claims, 13 Drawing Sheets

(56) References Cited

U.S. PATENT DOCUMENTS

| | | | | |
|---|---|---|---|---|
| 9,686,891 | B2* | 6/2017 | Campbell | H05K 7/20781 |
| 9,839,163 | B2* | 12/2017 | Keisling | H05K 7/20781 |
| 10,111,367 | B2* | 10/2018 | Kodama | H05K 7/20818 |
| 10,292,313 | B2* | 5/2019 | Magallanes | H05K 7/20754 |
| 10,356,949 | B2* | 7/2019 | Pan | H05K 7/20772 |
| 10,485,140 | B2* | 11/2019 | Kawamoto | H05K 7/20736 |
| 10,701,839 | B2* | 6/2020 | Chainer | H05K 7/2079 |
| 10,772,238 | B1* | 9/2020 | Ross | H05K 7/2079 |
| 10,869,411 | B2* | 12/2020 | Magallanes | H05K 7/20818 |
| 2004/0100770 | A1* | 5/2004 | Chu | H05K 7/20754 |
| | | | | 361/698 |
| 2010/0248609 | A1* | 9/2010 | Tresh | H05K 7/20745 |
| | | | | 165/104.34 |
| 2010/0263830 | A1* | 10/2010 | Noteboom | H05K 7/2079 |
| | | | | 165/80.2 |
| 2011/0239683 | A1* | 10/2011 | Czamara | H05K 7/20745 |
| | | | | 62/259.4 |
| 2011/0259573 | A1* | 10/2011 | Ezawa | F24F 5/0007 |
| | | | | 165/50 |
| 2012/0279684 | A1* | 11/2012 | Keisling | G06F 1/20 |
| | | | | 62/526 |
| 2014/0133099 | A1* | 5/2014 | Campbell | H05K 7/20818 |
| | | | | 361/698 |
| 2014/0190204 | A1* | 7/2014 | Oki | H05K 7/20827 |
| | | | | 62/513 |
| 2014/0260369 | A1* | 9/2014 | LePoudre | F28D 15/00 |
| | | | | 62/314 |
| 2014/0321050 | A1* | 10/2014 | Sato | H05K 7/20754 |
| | | | | 361/679.47 |
| 2015/0351289 | A1* | 12/2015 | Krietzman | H05K 7/20754 |
| | | | | 361/679.46 |
| 2016/0014933 | A1* | 1/2016 | Matsunaga | H05K 7/20827 |
| | | | | 361/679.53 |
| 2016/0014934 | A1* | 1/2016 | Shiraiwa | F25B 25/005 |
| | | | | 361/679.53 |
| 2016/0037685 | A1* | 2/2016 | Ross | H05K 7/20718 |
| | | | | 165/104.19 |
| 2016/0282023 | A1* | 9/2016 | Matsunaga | F25B 39/00 |
| 2017/0238444 | A1* | 8/2017 | Slessman | H05K 7/20818 |
| | | | | 361/679.47 |
| 2018/0270981 | A1* | 9/2018 | Miranda Gavillan | |
| | | | | G11B 33/144 |
| 2019/0159365 | A1* | 5/2019 | Snip | E04B 5/48 |
| 2021/0051819 | A1* | 2/2021 | Gao | H05K 7/20681 |

OTHER PUBLICATIONS

Response to Restriction Requirement filed on Jun. 22, 2021 in U.S. Appl. No. 16/375,923.
Office Action dated Jul. 7, 2021 in U.S. Appl. No. 16/375,923.
Amendment filed on Aug. 11, 2021 in U.S. Appl. No. 16/375,923.

* cited by examiner

DATA CENTER COOLING SYSTEM

CROSS-REFERENCE TO RELATED APPLICATIONS

This application is a continuation-in-part of U.S. patent Ser. No. 11/202,394, filed Apr. 5, 2019, for "Data Center Cooling System," naming Weems and Martin as inventors, which claims the benefit of U.S. Provisional Patent Application Ser. No. 62/751,492, filed Oct. 26, 2018, for "Data Center Cooling System," also naming Weems and Martin as inventors, each of which is hereby incorporated by reference in its entirety.

TECHNICAL FIELD

The present disclosure generally relates to cooling systems, and in particular, cooling systems for data centers.

BACKGROUND OF THE DISCLOSURE

Data centers generally house a large number of computer systems usually disposed on typical server racks. The computer systems generate a high quantity of heat that needs to be removed from the data center. The removal of this heat consumes a lot of power. About one third of the power consumed by a data center is for cooling.

One type of rack used in data centers is known broadly as a Chatsworth rack, available from Chatsworth Products Inc., Toronto, Canada. Various models of such racks are available. Information about such racks is available at www.chatsworth.com.

A standard cooling system often used in a data center delivers cool air to the front of a rack of servers or other IT equipment. This cool air is cooler than the outside air for most of the year in some data center locations. Warm air from the back of the rack is sent to an air handler to cool the air. The heat exchanged to the air handler is removed, typically by a chilled water system.

To improve separation of heated air from room air and reduce air handling requirements, server racks may be arranged in a specific way. Another typical arrangement is the use of a chimney system. A chimney system encloses the rear of a rack and provides a conduit for air heated by the IT equipment. The heated air then may be removed from the chimney, cooled by an air handler, and returned to the front of the server racks. The air in the chimney often is warmer than the outside air temperature or wet bulb temperature and is expensive to cool.

Therefore, there is a need in the art for a system and method that addresses the shortcomings of the prior art discussed above.

SUMMARY OF THE DISCLOSURE

In one aspect, the disclosure provides a cooling system configured to remove heat from a chimney of a server cabinet. The system comprises a first heat exchanger unit sized and configured for installation into the chimney of the server cabinet. The first heat exchanger has a fluid inlet for receiving a working fluid and a fluid outlet for discharging the working fluid. The first heat exchanger also has an upstream surface receiving waste heat generated by one or more servers and a downstream surface that discharges air cooled by the first heat exchanger. The upstream surface is generally perpendicular to the downstream surface.

In another aspect, the disclosure provides a cooling system for a data center. The system comprises a first cooling circuit configured to remove heat from a chimney of a server cabinet. The first cooling circuit includes a first heat exchanger sized and configured for installation into the chimney of the server cabinet. The first heat exchanger has a fluid inlet for receiving a working fluid and a fluid outlet for discharging the working fluid. The first cooling circuit pre-cools a portion of the heated air in the return air plenum.

The system also includes a second cooling circuit that receives heated air from a return air plenum, cools the heated air in an air handling unit, and conveys cool air to a supply air plenum.

In still another aspect, the disclosure provides a cooling system for a data center. The system includes a first cooling circuit configured to remove heat from a chimney having a door in an opening of a server cabinet. The first cooling circuit comprises a first heat exchanger sized and configured for installation into the chimney of the server cabinet. The first cooling circuit pre-cools a portion of the heated air in the return air plenum.

The first heat exchanger has a fluid inlet for receiving a working fluid and a fluid outlet for discharging the working fluid. The first heat exchanger is mounted to be reversibly removable from the chimney through the door opening without disconnecting the fluid inlet for receiving a working fluid and without disconnecting the fluid outlet for discharging the working fluid.

The cooling system also has a second cooling circuit that receives heated air from a return air plenum, cools the heated air in an air handling unit, and conveys cool air to a supply air plenum.

In yet another aspect, the disclosure provides a high-efficiency cooling system. The system removes heat from a rack of servers in a cabinet having a chimney. The system includes a heat exchanger in which the working fluid may change phase as a result of absorbing heat in the chimney. The heat exchanger is disposed in the chimney above, or higher than, the top of the servers in the rack.

In this aspect, access to the servers through the chimney is unencumbered by heat exchange equipment. Thus, there is no need to move heat exchanger equipment to access the back of the server rack through the chimney.

Other systems, methods, features, and advantages of the invention will be, or will become, apparent to one of ordinary skill in the art upon examination of the following figures and detailed description. It is intended that all such additional systems, methods, features, and advantages be included within this description and this summary, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like reference numerals identify substantially identical partnership.

DETAILED DESCRIPTION

Figure 1:
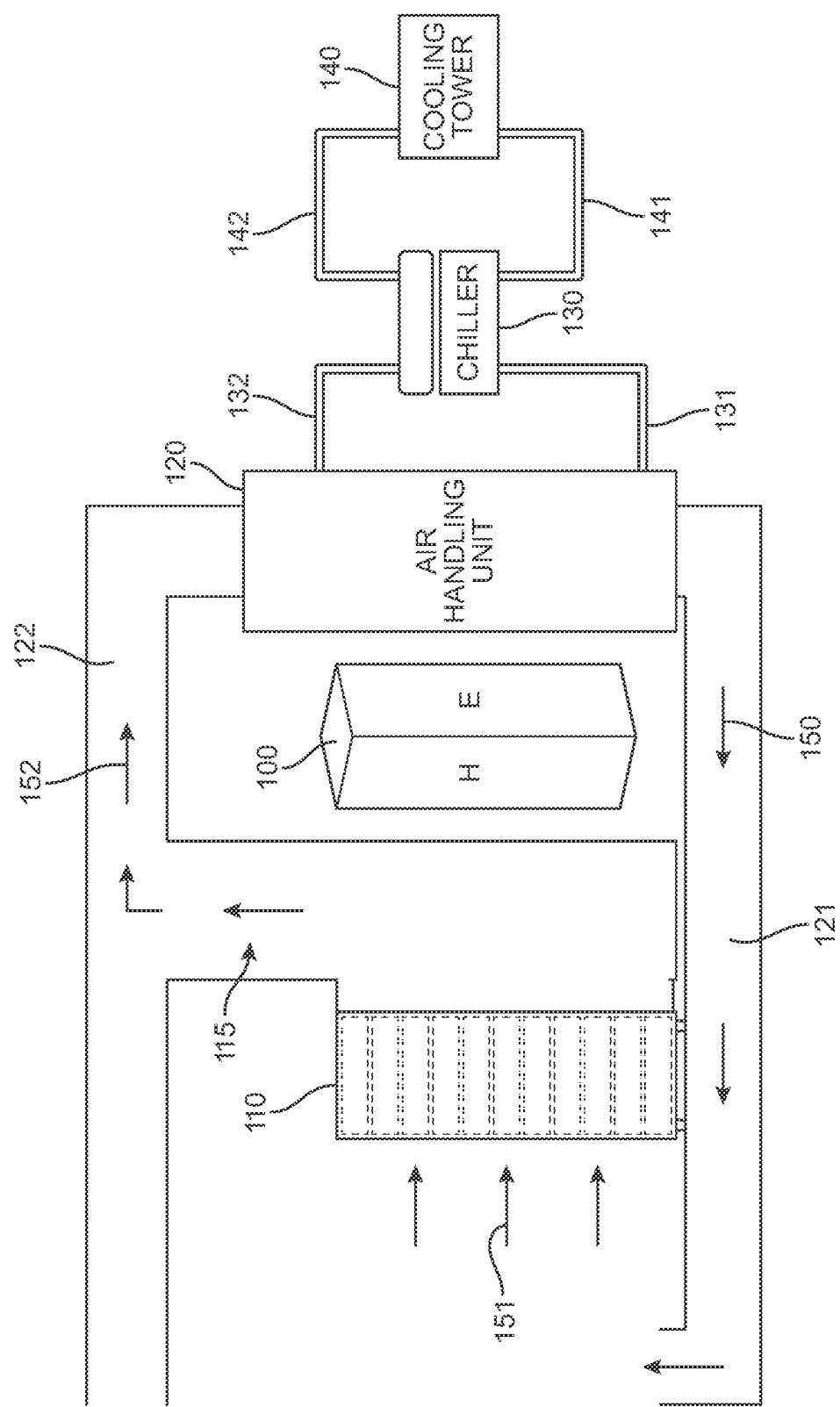
FIG. 1 is a schematic diagram of a typical data center air handling system.

Referring to FIG. 1, which illustrates a typical air handling regime in a data center, such centers typically include a source of cooled air in the form of a supply air plenum 121. The cooled air flowing in the direction of arrow 150 serves as the ambient air 151 that is made available to computer systems and servers 110 in the data center. Computer systems 110 generate heat and the cooled ambient air flowing in the direction of arrow 151 is heated by the computer systems. The computer systems have fans that direct the heated air to a chimney 115 disposed behind and downstream of the computer system. The heated air flowing in the direction of arrow 152 can be collected in a ceiling return air plenum 122. This heated air 152 is then conveyed to an air handling unit 120. Air handling unit 120 includes some kind of heat exchanger 100 to cool the air. The air handling unit is in thermal communication with a chiller 130 that removes heat from warm working fluid 132. The chiller then supplies cool fluid 131 to the air handling unit 120 and that air can be used to cool in incoming heated air 152 collected by the return air plenum 122. Warm fluid 132 is returned to chiller 130. After the air has been cooled, the air handling unit 120 can discharge this cool air into the supply air plenum 121, which returns cool air 151 to the data center. Heat is removed from the warm working fluid 132 from chiller 130 by cooling tower 140, where warm fluid 142 is cooled to produce cool fluid 141. This circulation of ambient air also can be considered a cycle.

In one aspect, the disclosure provides a cooling system configured to remove heat from a chimney of a server cabinet. The system also may be called a chimney cooling system. The system comprises a first heat exchanger unit sized and configured for installation into the chimney of the server cabinet. The first heat exchanger has a fluid inlet for receiving a working fluid and a fluid outlet for discharging the working fluid. The first heat exchanger also has an upstream surface receiving waste heat generated by one or more servers and a downstream surface that discharges air cooled by the first heat exchanger. The upstream surface is generally perpendicular to the downstream surface.

Figure 2:
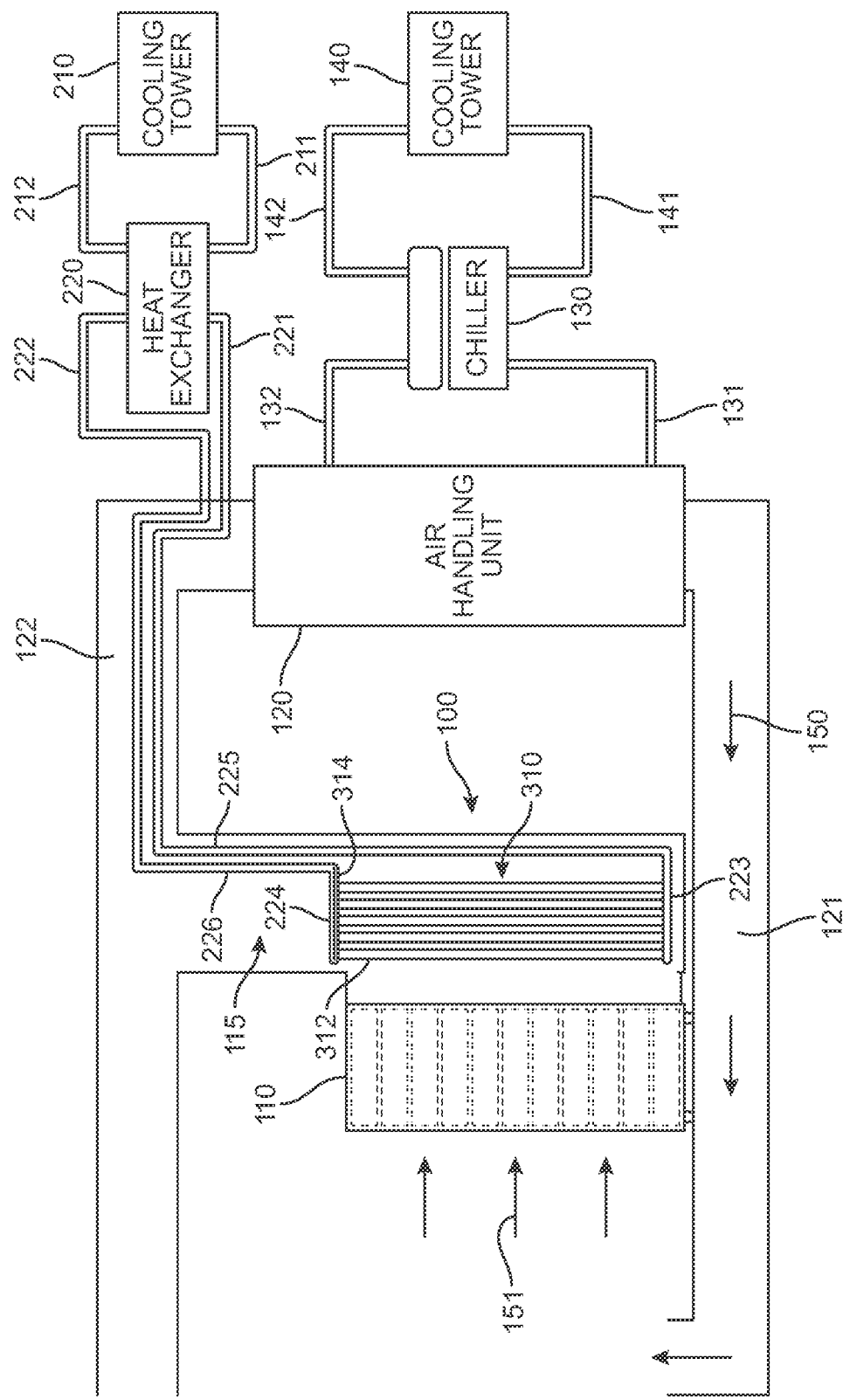
FIG. 2 is a schematic diagram of an embodiment of the disclosure.
Figure 3:
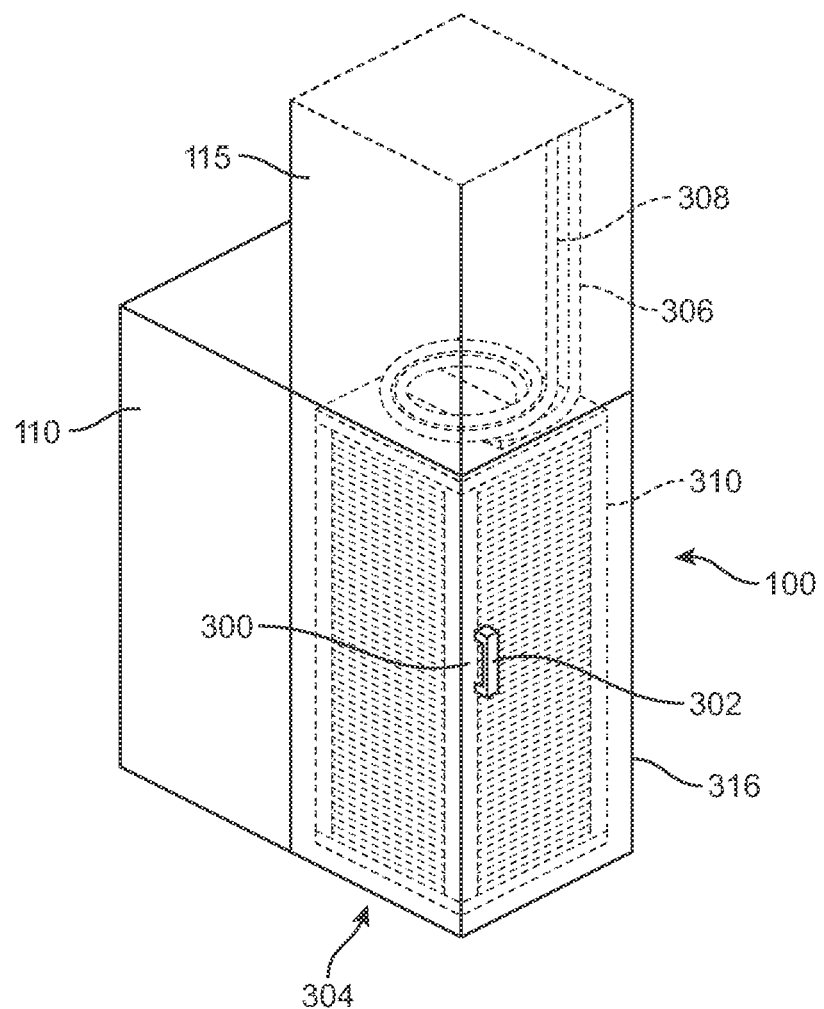
FIG. 3 is a schematic diagram of a heat exchanger in a data center chimney.

Referring to FIG. 2 and FIG. 3, an embodiment of a chimney cooling system 100 is shown. The chimney cooling system 100 includes a chimney heat exchanger 310 that is sized and configured to fit inside a chimney 115 of a server cabinet 304. Heated air that is located downstream of the servers 110 and disposed in the chimney 115 can be cooled by the chimney cooling system 100. The chimney heat exchanger 310 includes a fluid inlet 223 disposed at the bottom of the heat exchanger 310, and fluid outlet 224 disposed at the top of the heat exchanger. In this embodiment, working fluid flows concurrently with heated air.

Any suitable fluid may be used as the working fluid for chimney heat exchanger 310, which also is called the first heat exchanger. Any fluid capable of transferring heat in the temperature ranges present in the system may be used. Different embodiments may use water or different kinds of refrigerant. In one embodiment, refrigerant R-410A may be used. In another embodiment, ammonia refrigerant may be used as working fluid.

From the fluid outlet 224 of the chimney heat exchanger 310, the working fluid is conveyed to a second heat exchanger 220 in concurrent flow embodiments. In concurrent flow, pipe 226 carries hot working fluid to second heat exchanger 220 through port 222. Working fluid from the chimney heat exchanger 310 may be cooled in second heat exchanger 220. In some cases, this second heat exchanger 220 is in thermal communication with a cooling tower 210. Cooled working fluid from the second heat exchanger 220 is returned by way of port 221 and through pipe 225 to the inlet 223 of the chimney heat exchanger. The cooled working fluid is distributed through the chimney heat exchanger 310 and the chimney heat exchanger removes heat generated by the computer systems or servers 110 disposed upstream. In some cases, these servers 110 are disposed in the server cabinet directly in front of the chimney heat exchanger 310. Heat is removed from heat exchanger 220 by causing warm working fluid to flow through pipe 212 to cooling tower 210. Pipe 211 carries cool working fluid to heat exchanger 220, where it is used to cool the working fluid for heat exchanger 310.

The chimney heat exchanger 310 includes an inlet surface 312 that faces the rear of the servers. This inlet surface 312 is generally disposed vertically. In contrast, the outlet surface 314 of the chimney heat exchanger 310 is generally disposed horizontally. In other words, as shown in FIG. 2, the air entering the chimney heat exchanger is the result of heating inlet airflow 151 and is generally travelling in a horizontal direction. And the air exiting the chimney heat exchanger is generally travelling in a vertical direction, as illustrated on FIG. 1. The chimney heat exchanger 310 is disposed at a bend as the heated air is being routed to the return air plenum 122.

Locating the chimney heat exchanger 310 in this location is advantageous for several reasons:

(1) the bend or change in direction of air flow can slow the mass flow rate of the air, thus allowing additional time for the heated air to interact with the chimney heat exchanger;

(2) the chimney cavity, and therefore the chimney heat exchanger, is much larger than a rear door type cooling system, which has coolers mounted on the rear door 300 (see FIG. 3). This larger size allows the chimney heat exchanger to present a much greater surface area to the heated air, thereby increasing the efficiency and the cooling capacity of the chimney heat exchanger over a rear door type cooling system.

In some embodiments, the working fluid can experience a phase change within the chimney heat exchanger. Generally, this phase change will be from a liquid to a gas, and will occur within the chimney heat exchanger 310. Chimney cooling systems that employ a phase change in the chimney heat exchanger can remove heat in proportion to the latent heat of vaporization or the heat associated with the enthalpy of vaporization of the working fluid. Typically, the heat of vaporization is large compared with the heat capacity of the working fluid liquid, so that a smaller amount of working fluid is required to remove the heat from the air than is required for a single-phase system. This can significantly improve the heat removal capacity of the chimney cooling system, or can be used to reduce the size of a system. Some embodiments can also be designed so that the working fluid experiences a second phase change at the second heat exchanger. This second phase change can be from a gas to a liquid in a condensation stage.

The chimney cooling system can be designed to be partially passive or completely passive. A completely passive system would not require a pump or blower to circulate the working fluid to and from the chimney heat exchanger to the second heat exchanger. Proper design using the right pressure, working fluid, and possibly gravitational height differences between the chimney heat exchanger and the second heat exchanger can result in a fully passive system that would not require a pump or blower. Some partially passive systems can use a low capacity pump or blower to assist in circulating the working fluid.

In embodiment of the disclosure, chimney heat exchanger 310 is operated in a concurrent flow regime. This flow arrangement is particularly suitable for a two-phase system. In some embodiment of the disclosure, chimney heat exchanger 310 may be operated in a countercurrent regime. In such embodiments, which are particularly suitable for single-phase systems, cool working fluid flows through pipe 226 and enters chimney heat exchanger 310 at port 224. Working fluid then flows downwardly and exits chimney heat exchanger 310 through port 223. Additional piping changes may be required to direct working fluid to the correct connection with heat exchanger 220.

As shown in FIG. 2, the chimney cooling system 100 can be part of a multi-circuit cooling system for the data center. The chimney cooling system 100 can provide an initial temperature drop to the heated air 152 just downstream of the servers. After being treated by the chimney cooling system 100, the air can then be fed into the return air plenum 121 for treatment by another cooling system circuit using the air handling unit and its associated chiller.

In another aspect, the disclosure provides a cooling system for a data center. The system comprises a first cooling circuit configured to remove heat from a chimney 115 of a server cabinet 304, as shown on FIG. 2 and FIG. 3. The first cooling circuit includes a first heat exchanger 310 sized and configured for installation into the chimney 115 of the server cabinet 304. The first heat exchanger 310 has a fluid inlet 223 for receiving a working fluid and a fluid outlet 224 for discharging the working fluid. The first cooling circuit pre-cools a portion of the heated air 152 in the return air plenum 122.

The system also includes a second cooling circuit that receives heated air from a return air plenum 122, cools the heated air in an air handling unit 120, and conveys cool air to a supply air plenum 121. Air handling unit 120 exchanges heat from air flow 152 to a coolant in air handling unit 120. The fluid flow 132, which is warm, is cooled in chiller 130 and returned to cool air in the air handling unit as cold fluid flow 131.

Heat is removed from the air handling unit working fluid in cooling tower 140. Warm fluid 142 flows to cooling tower 140, and cool fluid is retuned to chiller 130 as fluid 141.

In still another aspect, the disclosure provides a cooling system for a data center. As shown in FIG. 3, the system 100 includes a first cooling circuit configured to remove heat from a chimney 115 having a door 300 in an opening 316 of a server cabinet. The first cooling circuit comprises a first heat exchanger 310 sized and configured for installation into the chimney 115 of the server cabinet 304. The first cooling circuit pre-cools a portion of the heated air in the return air plenum 122.

First heat exchanger 310 has a fluid inlet 223 for receiving a working fluid and a fluid outlet 224 for discharging the working fluid. First heat exchanger 310 is mounted to be non-destructibly and reversibly removable from chimney 115 through door opening 316 without disconnecting the fluid inlet for receiving cool working fluid from port 223 by way of hose 306, and without disconnecting the fluid outlet for discharging the working fluid through port 224 by way of hose 308.

The system also includes a second cooling circuit that receives heated air from a return air plenum 122, cools the heated air in an air handling unit 120, and conveys cool air to a supply air plenum 121.

Figure 4:
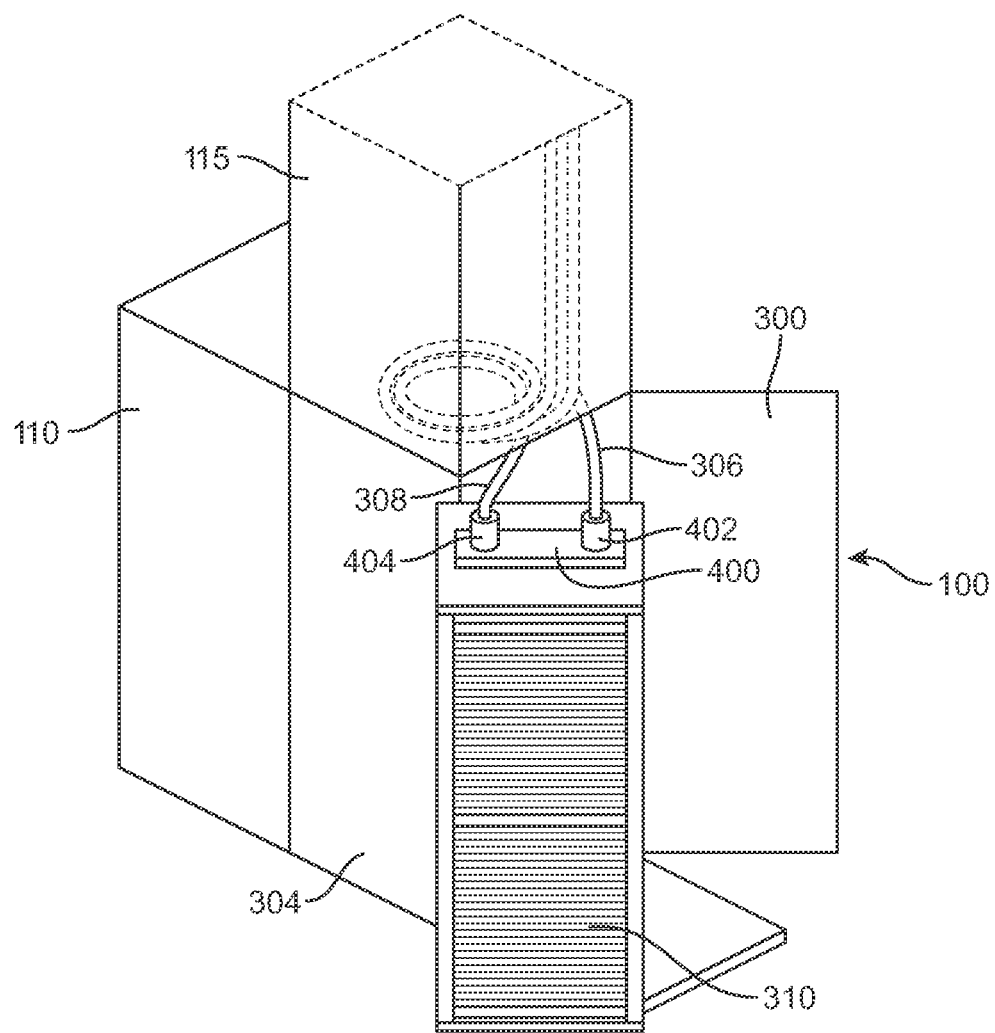
FIG. 4 is a schematic diagram of an embodiment of the disclosure.

Handle 302 on door 300 of cabinet 304 indicates which way door 300 pivots for access to chimney 115. As shown in FIG. 4, hose 308 is connected to first connector 404 and hose 306 is connected to second connector 402. First connector 404 and second connector 402 are mounted on connector base plate 400 for convenience. Base plate is mounted on chimney heat exchanger 310. Thus, working fluid flows to heat exchanger 310 through first connector 404 and second connector 402.

FIG. 4 illustrates features of some embodiments, in which heat exchanger 310 is non-destructibly and reversibly removable from cabinet 304. In embodiments illustrated in FIG. 4, heat exchanger 310 is mounted so that it can be completely removed from the chimney through opening 316 when door 300 is open. Heat exchanger 310 is completely removed from cabinet 304 and pivoted in the direction opposite the direction the door 300, as shown on FIG. 4. This arrangement for these features makes it possible to access the door opening 316 completely unencumbered by door 300 and to non-destructibly and completely remove heat exchanger 310 from chimney 115 without disconnecting heat exchanger 310 from chimney cooling system 100.

Figure 5:
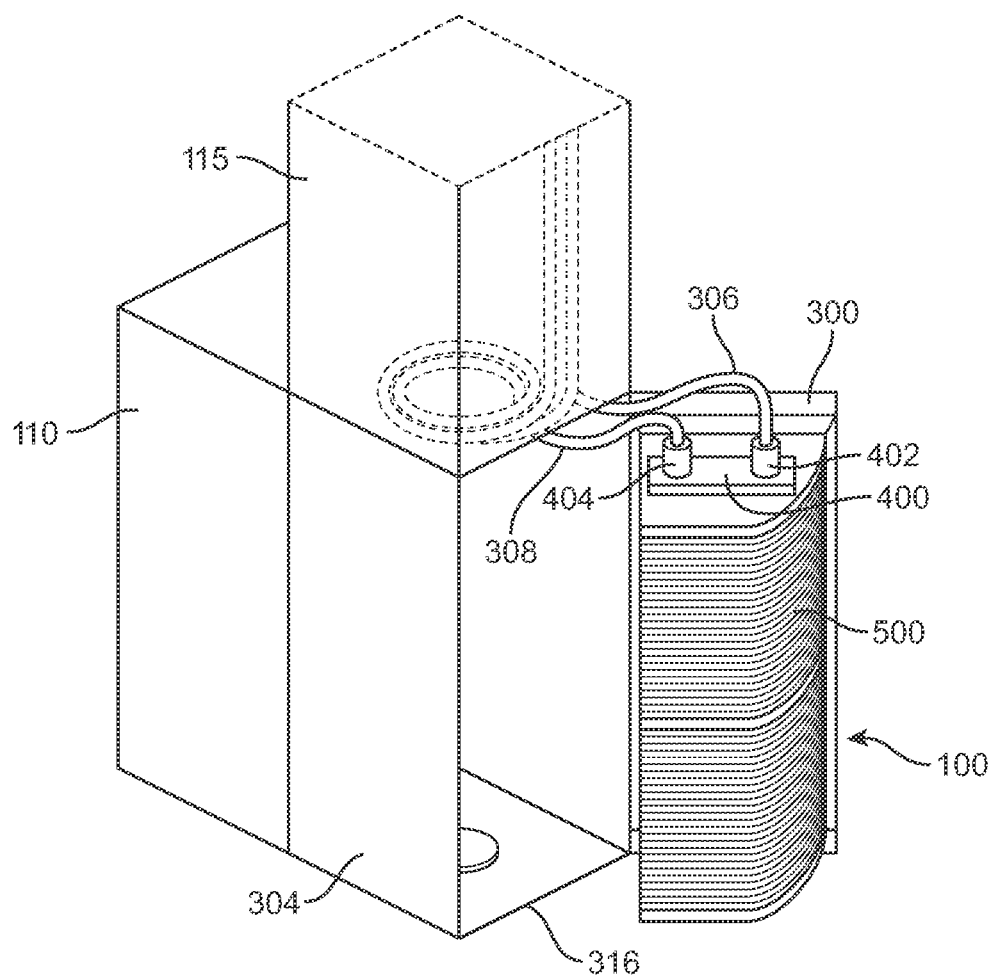
FIG. 5 is a schematic diagram of another embodiment of the disclosure.

In other embodiments, first heat exchanger, or chimney heat exchanger, 500 may be mounted on the inside surface of door 300, as illustrated in FIG. 5. As illustrated, in system 100, cabinet 304 includes door opening into which door 304 enters or abuts to close the cabinet. First hose 308 is connected to first connector 404 and second hose 306 is connected to second connector 402. First connector 404 and second connector 402 are mounted on connector base plate 400 for convenience. First connector 404 and second connector 402 may contain valves or other methods to seal the working fluid into first hose 308 and second hose 306. First connector 404 and second connector 402 also may seal the heat exchanger connections. Base plate is mounted on chimney heat exchanger 310. Thus, working fluid flows to heat exchanger 310 through first connector 404 and second connector 402.

As shown in FIG. 5, chimney heat exchanger 500 is curved on the side of the door opposite the hinge. This curve is necessary to make it possible to open door 300 and to pivot heat exchanger 500 to be completely clear of the cabinet 304 for ease of access.

In some embodiments, heat exchanger 310 is a tube-and-fin heat exchanger. As illustrated at 600 in FIG. 6, heat exchanger 600 comprises an array of tube-and-fin assemblies comprising tube 604 and radiating fins 602. In some embodiments, the tube-and-fin assemblies are arranged vertically, as at 600. In some embodiments, the tube-and-fin heat assemblies may be arranged horizontally, as illustrated in FIG. 7. Working fluid flows through tube 702, and radiating fins 704 extend into the air flow to cool the air.

Figure 6:
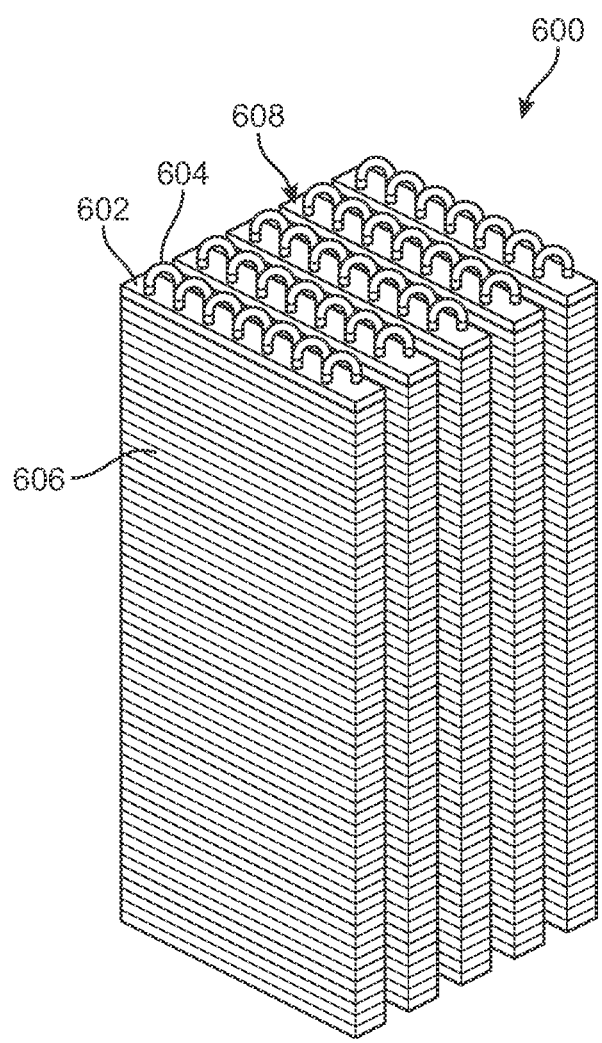
FIG. 6 is a schematic diagram of an embodiment of a heat exchanger of the disclosure.
Figure 7:
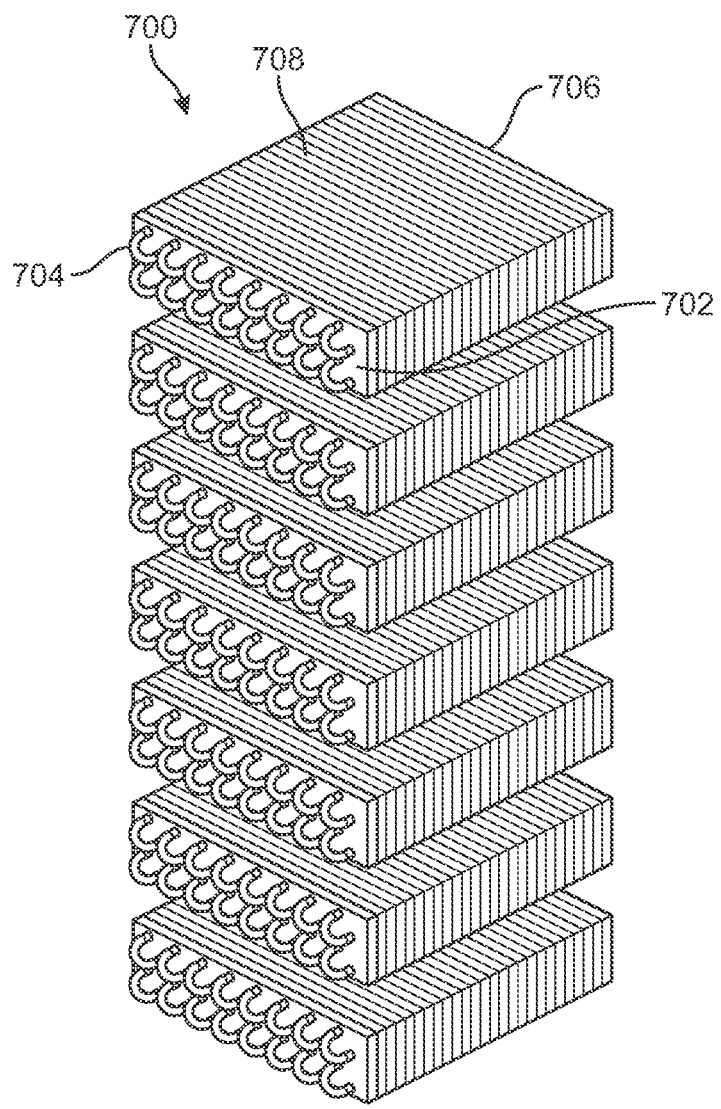
FIG. 7 is a schematic diagram of another embodiment of a heat exchanger of the disclosure.

A difference between the embodiments that are horizontal, as in FIG. 6, and embodiments that are horizontal, as in FIG. 7, is highlighted by a difference between these figures. In FIG. 6, surface 606 is inlet surface 312, and surface 608, which extends across the end area of the tube-and-fin elements, is outlet surface 314. Thus, as can be seen, air flows into and through the fins of the first element and past tubes 604, which are arranged vertically. Air will rise in the space between tube-and-fin elements and flow out through outlet area 608.

In other embodiments, such as an embodiment illustrated in FIG. 7, surface 706 at the ends of the tube-and-fin elements, which cannot be seen in FIG. 7, is the inlet surface 312. Surface 708 is outlet surface 314. Thus, air to be cooled flows over the ends of the tube-and-fin elements and flows out between the fins on element closest to the fluid exit in exit surface 314.

Figure 8:
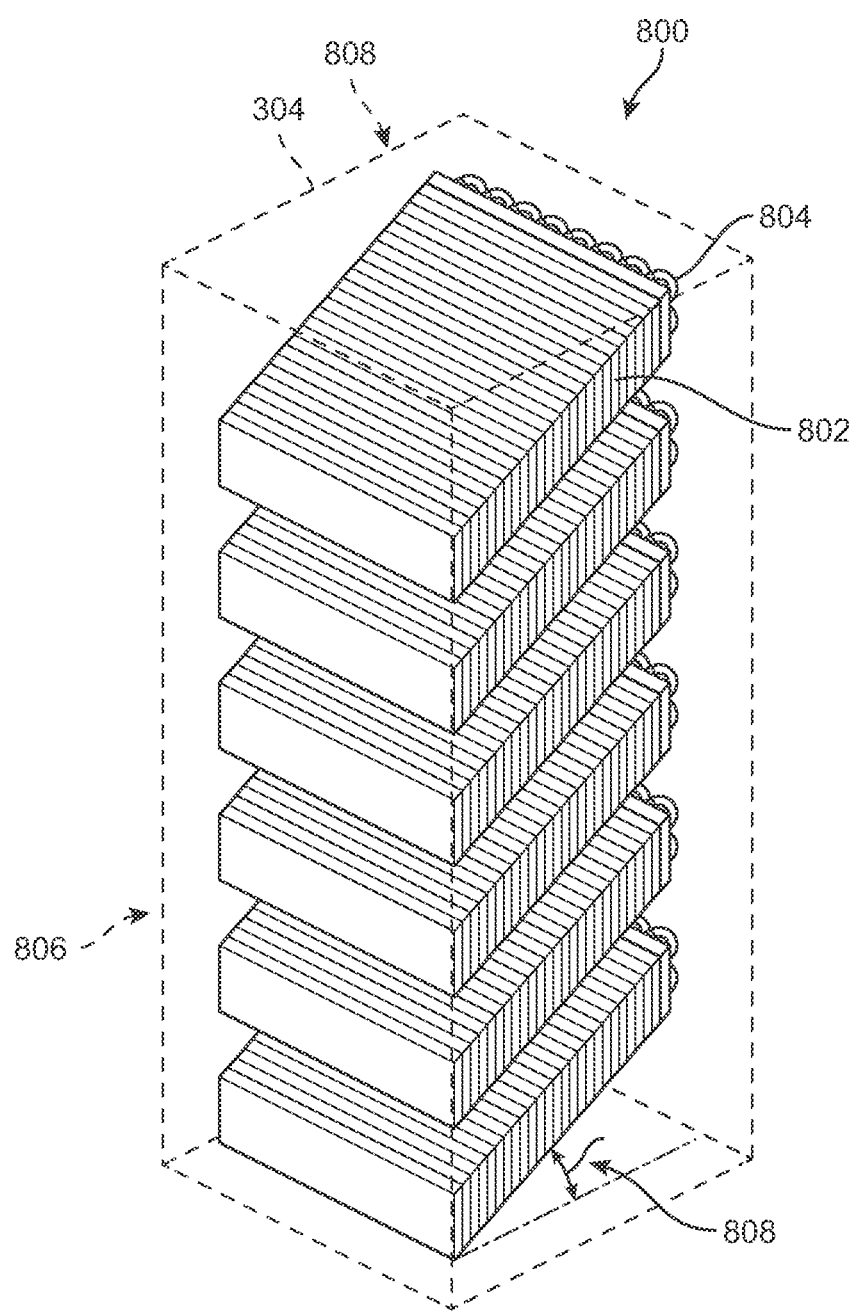
FIG. 8 is a schematic diagram of yet another embodiment of a heat exchanger of the disclosure.

In still another embodiment, such as illustrated in FIG. 8, the tube-and-fin assemblies may be arranged at an angle θ 810 from horizontal. Working fluid flows in tube 802. Radiators 804 not only aid heat transfer, but also tend to urge the air to flow upward within chimney 115. Typically, angle θ is between about 5° and about 40°, typically between about 10° and about 30°, and more typically between about 15° and about 25°.

Figure 9:
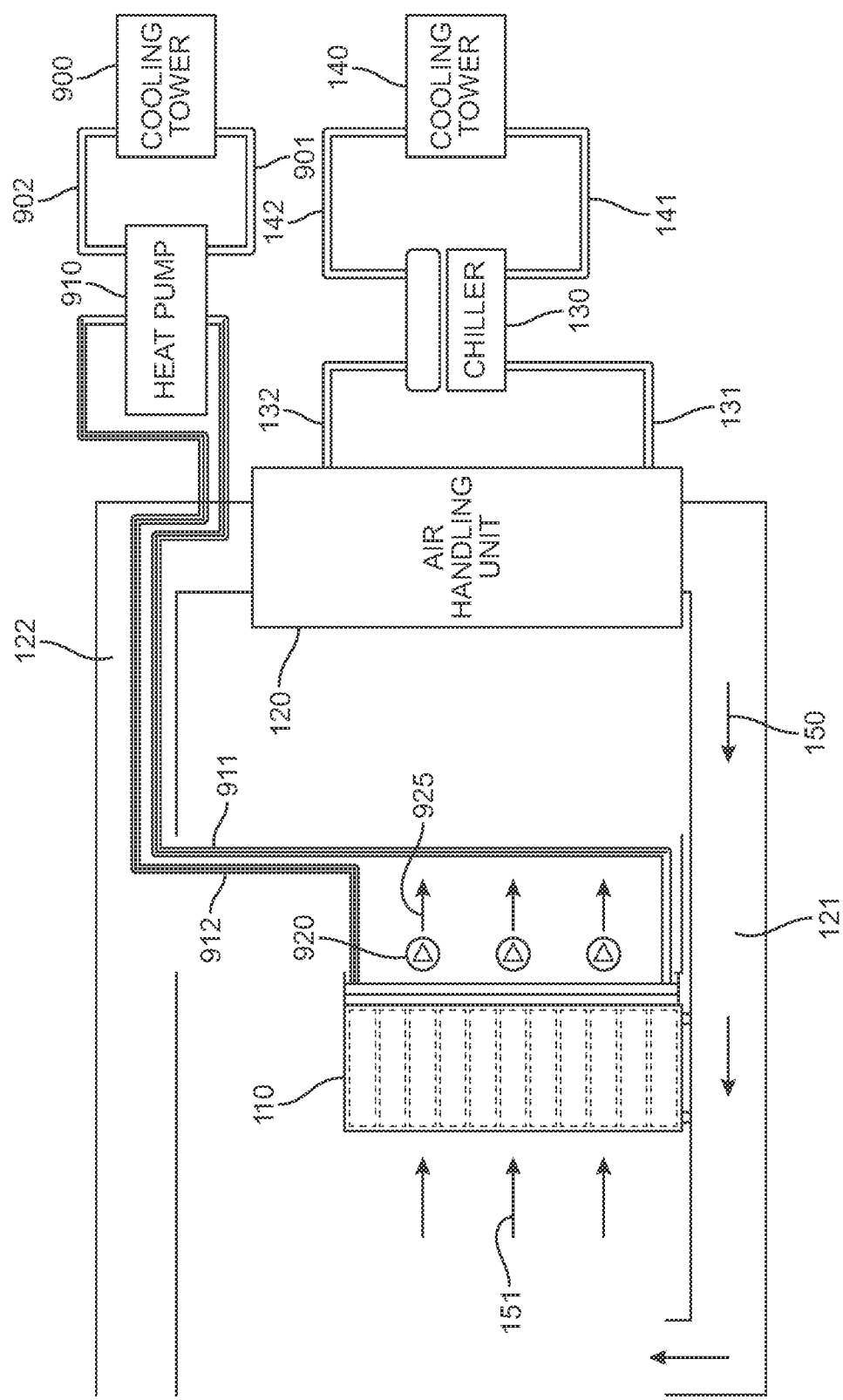
FIG. 9 is a schematic diagram of another embodiment of the disclosure.

FIG. 9 illustrates use of embodiments of a cooling system that combines elements of known coolers with embodiments of the disclosure. FIG. 9 illustrates air handling unit 120 providing cooled air 150 through plenum 121, yielding air 151 to cool servers 110. The air handling unit 120 receives warm air from plenum 122. Chiller 130 and cooling tower 140 serve as described above.

Fan 920 illustrates a known system wherein air is drawn over a cooling surface and is urged in the direction of direction arrow 925, and then to plenum 122. In some embodiments, a system wherein a working fluid is circulated from the cooling surface through pipe 912 to heat pump 910, where the fluid is cooled and returned to the cooling surface through pipe 911.

In some embodiments, a heat exchanger sized and configured to fit inside a chimney is disposed in a portion of the chimney above the servers. In some embodiments, the chimney may form part of the server rack structure. In some embodiments, a structure that serves as a chimney behind and above the server rack may be attached to the server rack. In either embodiment, the heat exchanger is disposed in the chimney above the server rack. With the heat exchanger disposed above the server rack, access to the server rack is unencumbered by the heat exchanger. Thus, the heat exchanger need not be moved to access the server rack from behind.

Figure 10:
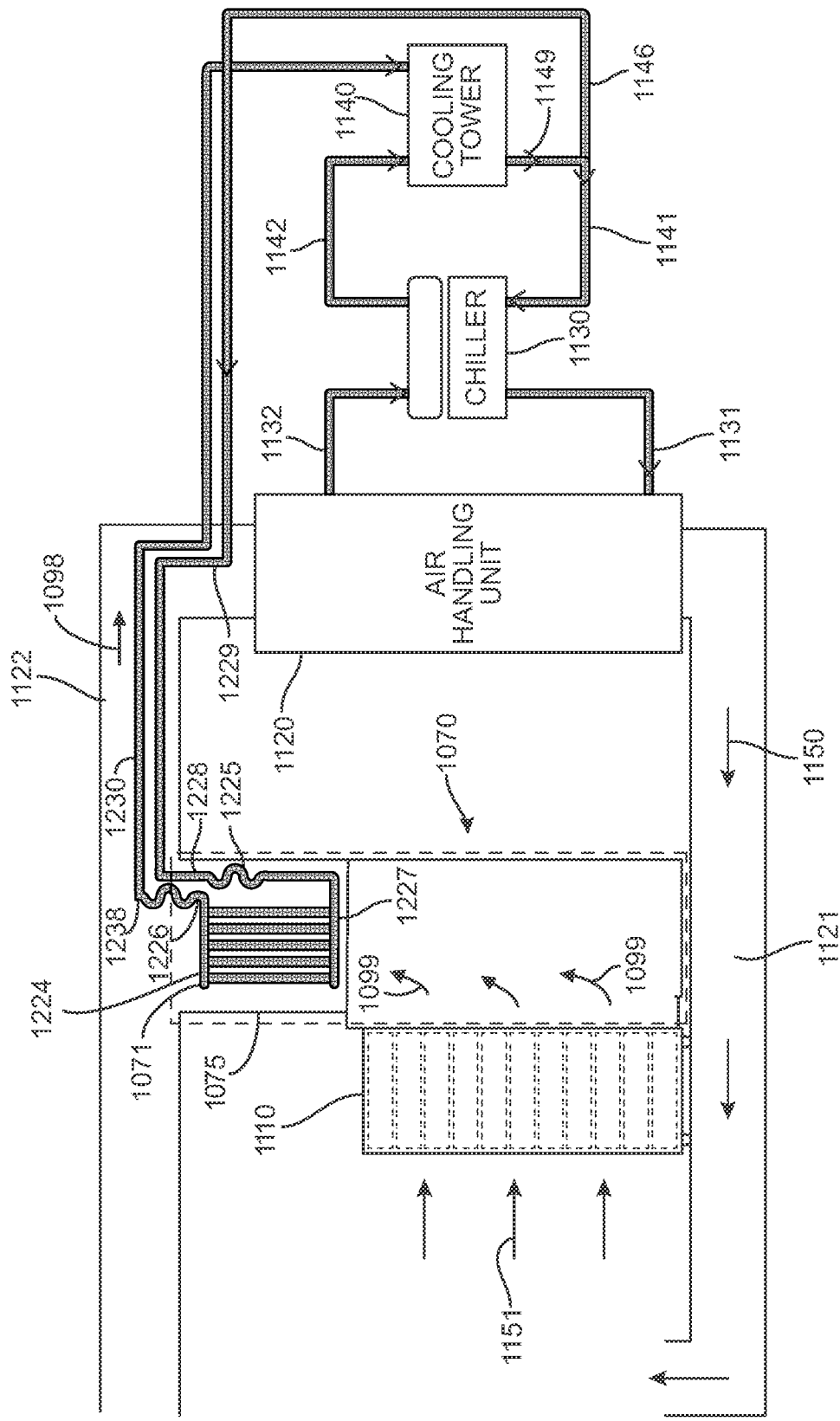
FIG. 10 is a schematic diagram of yet another embodiment of the disclosure.

FIG. 10 illustrates embodiments of the disclosure. Chimney cooling system 1070 is shown within a dashed line. Chimney cooling system 1070 includes chimney heat exchanger 1071 sized and configured to fit inside a portion of chimney cooling system 1070. In particular, chimney heat exchanger 1071 is disposed within upper portion 1075 of chimney cooling system 1070. Upper portion 1075 of chimney cooling system 1070 provides a space entirely above servers 1110. Heated air downstream of servers 1110 is carried to chimney upper portion 1075 in chimney cooling system 1070. This air is cooled in heat exchanger 1071.

Chimney heat exchanger 1071 includes a fluid inlet header 1227 fed by inlet pipe 1225 disposed at the bottom of chimney heat exchanger 1071. Fluid outlet header 1224 is disposed at the top of chimney heat exchanger 1071. Cool working fluid is introduced through inlet pipe 1225 and inlet header 1227 to chimney heat exchanger 1071. The working fluid is heated in chimney heat exchanger 1071, then flows out through outlet header 1224 and outlet pipe 1226. In this embodiment, therefore, flow of working fluid is concurrent with the flow of heated air.

Any suitable fluid may be used as the heat transfer fluid, or working fluid, for chimney heat exchanger 1071. Chimney heat exchanger 1071 also is called the first heat exchanger. Embodiments may use water or other heat transfer fluids as working fluid. For example, refrigerant R-410A may be used. In another embodiment, ammonia refrigerant may be used as working fluid. Specialty working fluids, such as R-32 and R-454B, may serve as environmentally-conscious working fluids. Heat exchange fluids have combinations of properties and characteristics that protect various aspects of the environment. For example, some fluids may be damaging the ozone layer, whereas other fluids may tend to raise atmospheric temperature. Environmentally-protective improved fluids often are developed. As they are developed, suitable fluids may be evaluated and used in embodiments of the disclosure.

As shown in FIG. 10, cool working fluid flows into chimney heat exchanger 1071 from conduit 1229, through flexible connection 1228, inlet pipe 1225, and inlet header 1227. Heated chimney heat exchanger fluid flows out through outlet header 1224, outlet pipe 1226, flexible outlet connector 1238, and into conduit 1230. The flexible connectors may be no-drip connections or may have valves or any structure that will block flow into or out of chimney heat exchanger 1071. Whereas valves may enable fluid isolation of chimney heat exchanger 1071, flexible connections further tend to isolate the chimney heat exchanger 1071 from movement of the rest of the system. These flexible connections are optionally used.

As shown in FIG. 10, conduit 1230 directs warm working fluid to cooling tower 1140. Throughout the disclosure, a stream of fluid may be identified as a stream or by the conduit through which it flows. The arrangement provides concurrent flow of heated air 1099 and flow of heat exchange fluid in heat exchanger 1071. Counter-current flow can be achieved by exchanging inlet flexible connector 1228 with outlet flexible connection 1238. Another way of obtaining counter-current flow is to provide a suitable header that allows for reversal of fluid flow direction. Other ways of reversing flow also are known.

FIG. 10 further illustrates that hot air 1099 cooled in chimney heat exchanger 1071 flows through return air plenum 1122 as air flow 1098. Air flow 1098 flows to air handling unit 1120 in a second cooling circuit. Air handling unit 1120 exchanges heat from warm air flow 1098 with cool coolant fluid 1131 in air handling unit 1120. Coolant fluid 1131 thus is heated in air handling unit 1120 and exits as warm cooling fluid 1132. Warm coolant 1132 is introduced to chiller 1130 to cool it. The cool fluid is returned to the second heat exchanger circuit as cool fluid 1131.

Air cooled in air handling unit 1120 flows out through air supply conduit 1121 as air flow 1150. This cooled air flow 1150 may be augmented with ambient air and introduced to the front of the servers 1110 as air flow 1151. Heat is removed from warm coolant stream 1132 in chiller 1130 by cool fluid 1141, which is returned to cooling tower 1140 as warm fluid 1142.

Warm fluid 1142 is and warm fluid 1230 from chimney heat exchanger 1271 are combined and cooled in cooling tower 1140. In embodiments, the cooled fluid 1449 from cooling tower is apportioned between chimney heat exchanger 1071 from conduit 1146 and chiller 1130 by way of conduit 1141. In some embodiments, streams 1142 and 1230 flow through cooling tower as separate streams and need not be separated or apportioned between stream 1142, which flows to chiller 1130, and cool stream 1146, which is returned to chimney heat exchanger 1071 in conduit 1229.

In some embodiments, efficiency can be increased over that of a single phase system by ensuring that the heat exchange fluid used in the chimney heat exchanger at least partially vaporizes in the heat exchanger. Such embodiments may remove more heat than single phase systems using the same size heat exchanger. That additional heat can be removed from the system and used elsewhere.

In some embodiments, at least about 20 percent of the heat absorbed or removed by the chimney heat exchanger is removed by the vaporized fraction of the chimney heat exchanger working fluid. More typically, at least about 30 percent of the heat absorbed or removed by the chimney heat exchanger is removed by the vaporized fraction of the chimney heat exchanger working fluid. Most typically, at least about 40 percent of the heat absorbed or removed by the chimney heat exchanger is removed by the vaporized fraction of the chimney heat exchanger working fluid. If the entirety of the chimney heat exchanger working fluid is vaporized, the fraction of the heat removed by the vaporization may be 50 percent or more.

Figure 11:
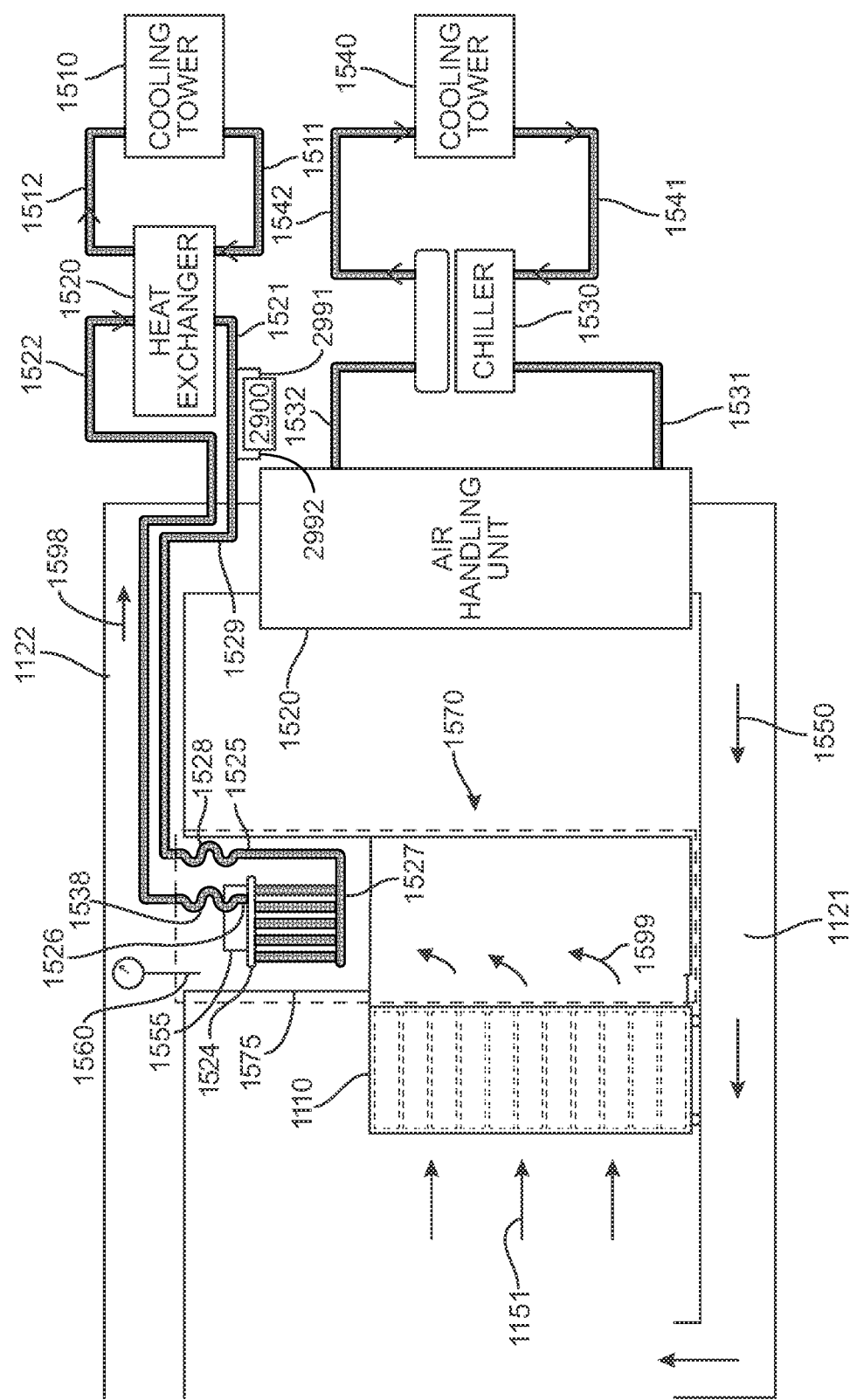
FIG. 11 is a schematic diagram of still another embodiment of the disclosure.

FIG. 11 illustrates an embodiment of the disclosure suitably employing a two-phase coolant. In some embodiments, chimney cooling system 1570, shown encompassed by the dashed line, includes two-phase heat exchanger 1571. Any suitable two-phase heat exchanger may be used. In some embodiments, two-phase heat exchanger 1571 is a tube-and-fin heat exchanger. Such a suitable chimney heat exchanger 1571 is illustrated in FIG. 6, FIG. 7, and FIG. 8.

In embodiments, two-phase heat exchanger 1571 is sized and configured to fit within upper portion 1575 of chimney cooling system 1570. Upper portion 1575 of chimney cooling system 1570 provides a space entirely above servers 1110. Heated air downstream of servers 1110 is carried to chimney upper portion 1575 in chimney cooling system 1570. This air is cooled in heat exchanger 1571.

Working fluid suitably used in two-phase heat exchanger 1571 is a fluid that vaporizes at least in part to remove heat from the system. In particular, the heat is removed from air flow 1599, and at least a portion of the working fluid vaporizes in two-phase heat exchanger 1571. Working fluid may be selected from the fluids described above, with the additional consideration that the fluid should at least partially vaporized at a temperature found in two-phase heat exchanger 1571.

FIG. 11 shows fan 1555 that may be optionally located in portion 1575 of chimney cooling system 1570. Fan 1555 is located above two-phase heat exchanger 1571. Fan 1555 ensures that hot air 1599 flows at a rate sufficient to provide heat sufficient to at least partially vaporize working fluid in two-phase heat exchanger 1571. Fan 1555 also ensures that the air flow is maintained at a volume sufficient to operate the system in case of an operation disruption in the system or in the servers.

FIG. 11 also illustrates optional temperature indicator 1560. Temperature indicator 1560 is located above two-phase heat exchanger 1571 or above fan 1555, if present. This temperature indicator may be used to ensure proper operation of chimney cooling system 1570.

In embodiments, flows of air and working fluids are analogous to those flows in embodiments of FIG. 2. In summary, working fluid, also identified herein as chimney heat exchanger fluid, is heated in two-phase heat exchanger. Hot working fluid is conveyed through outlet header 1524, outlet pipe 1526, and outlet flexible connector 1538 to conduit 1522. Working fluid flowing through conduit 1522 to second heat exchanger 1520. Flow of heat exchange fluid and of air from the servers 1599 may be concurrent, as shown in FIG. 11, or may be countercurrent.

Working fluid from chimney heat exchanger 1571 may be cooled in second heat exchanger 1520. In some embodiments, this second heat exchanger 1520 is in thermal communication with a cooling tower 1510. Cooled working fluid from second heat exchanger 1520 is returned by way of conduit 1521.

Figure 13A:
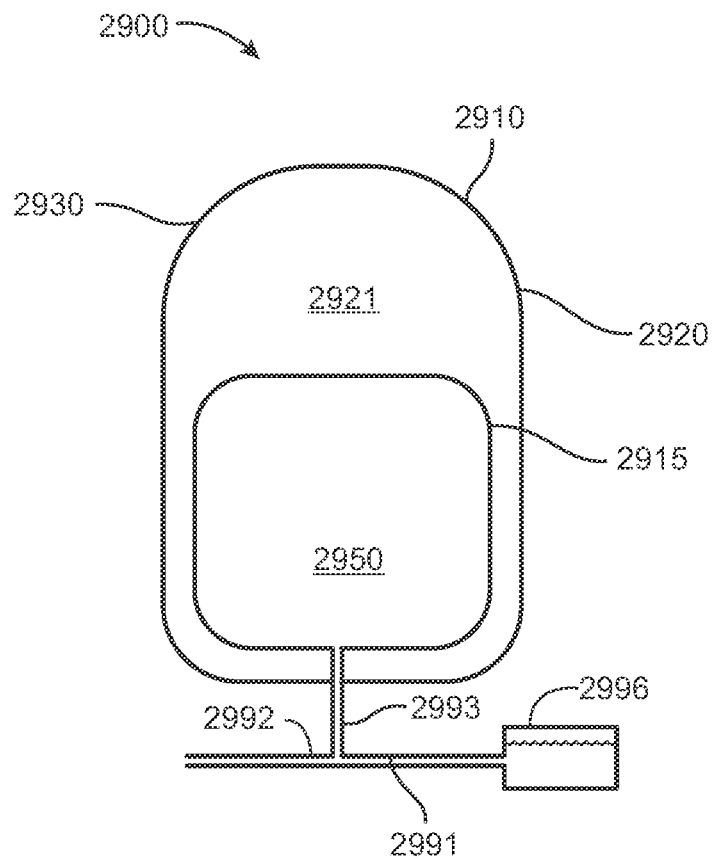
FIG. 13A is a schematic diagram of an embodiment of a fluid level controller of the disclosure.
Figure 13B:
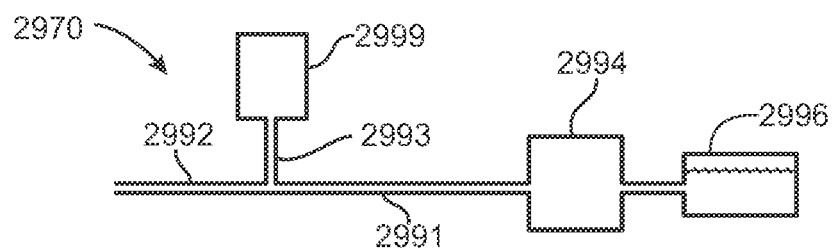
FIG. 13B is a schematic diagram of another embodiment of a fluid level controller of the disclosure.

Embodiments of chimney cooling system 1570 may differ from those of FIG. 2. For example, in some embodiments, steps to ensure that the volume of working fluid in two-phase heat exchanger 1571 remains within operable ranges may be required. In some embodiments, fluid level controller 2900 shown on FIG. 11 is installed on cool heat exchanger fluid 1521. Details of embodiments of fluid level controller 2900 are shown in FIG. 13A and FIG. 13B. Fluid level controller 2900 includes bladder tank 2910 comprising rigid shell 2930 and bladder 2915 within the shell 2930.

FIG. 13A illustrates pressure controller 2920. Pressure controller 2920 controls the pressure on pressurizing fluid 2921. Typically, such pressurizing fluid is water or air. Bladder 2915 is flexible and serves to separate pressurizing fluid 2921 in tank 2910 from heat exchanger fluid 2950 within bladder 2915. Increasing pressure on pressurizing fluid 2910 causes bladder 2915 to decrease in volume, thus forcing heat exchange fluid through pipe 2993 and, depending on the relative pressures between heat exchange fluid source 2996 and the pressure of cool heat exchange fluid 2992, will proportion additional heat exchange fluid between storage and use in two-phase heat exchanger 1575. For example, if the pressure in heat exchange fluid source 2996 and thus in conduit 2921 is higher than that in conduit 2992, additional heat exchange fluid will be introduced to the system. To remove heat exchange fluid from the system, the pressure in source 2996 or in bladder 2915 is lowered.

Another embodiment of a fluid level controller is disclosed in FIG. 13B as fluid level controller 2970. In this embodiment, fluid storage 2996 is connected to bidirectional pump 2994. Bidirectional pump 2994 controls the flow of fluid into and out of heat exchange fluid source 2996, thus determining whether heat exchange fluid is added to or removed from conduit 2992 through bidirectional conduit 2991. Thus, although this system may be used with bladder tank 2910, a simple tank 2999 suffices to absorb minor flow variances.

Returning to FIG. 11, conduit 1529 carries cooled heat exchange fluid as adjusted by fluid level controller 2900 to chimney heat exchanger 1571. Chimney heat exchanger removes heat generated by the servers 1100 and carried to chimney heat exchanger 1571 by air flow 1599.

In embodiments of the disclosure, return air plenum 1122 carries cooled air flow 1598 to air handling unit 1520. This air is further cooled in air handler unit 1520 by flow of cooled fluid 1531. Cooled air flows in supply air plenum 1121 as cooled supply air 1550. Cooled supply air 1550 can be augmented with ambient air to form air stream 1151. Air stream 1151 cools the rack of servers 1110. In the air handling unit 1520, warmed fluid is returned to chiller 1530 in conduit 1532.

In embodiments of the disclosure, warm working fluid from two-phase heat exchanger 1571 is introduced into a second fluid heat exchanger 1520 in a second fluid heat exchanger circuit. The warm working fluid is cooled in second fluid heat exchanger 1520 and returned by conduit 1521, together with any adjustment by fluid level controller 2900.

In some embodiments, cooling tower 1510 takes heat from second heat exchanger 1520 as stream 1512. Cooled fluid is returned to second heat exchanger 1520 through conduit 1511.

In embodiments wherein working fluid experiences a phase change by vaporization, vaporization typically occurs in two-phase heat exchanger 1571. Chimney cooling systems that employ a phase change in the chimney heat exchanger can remove heat in proportion to the latent heat of vaporization or the heat associated with the enthalpy of vaporization of the working fluid. Typically, the heat of vaporization is large compared with the heat capacity of the working fluid liquid, so that a smaller amount of working fluid is required to remove the heat from the air than is required for a single-phase system. This can significantly improve the heat removal capacity of the chimney cooling system, or can be used to reduce the size of a system. Reduction of system size is especially important to minimize the size of the chimney above the rack. Some embodiments can also be designed so that the working fluid experiences a second phase change at the second heat exchanger. This second phase change can be from a gas to a liquid in a condensation stage.

Figure 12:
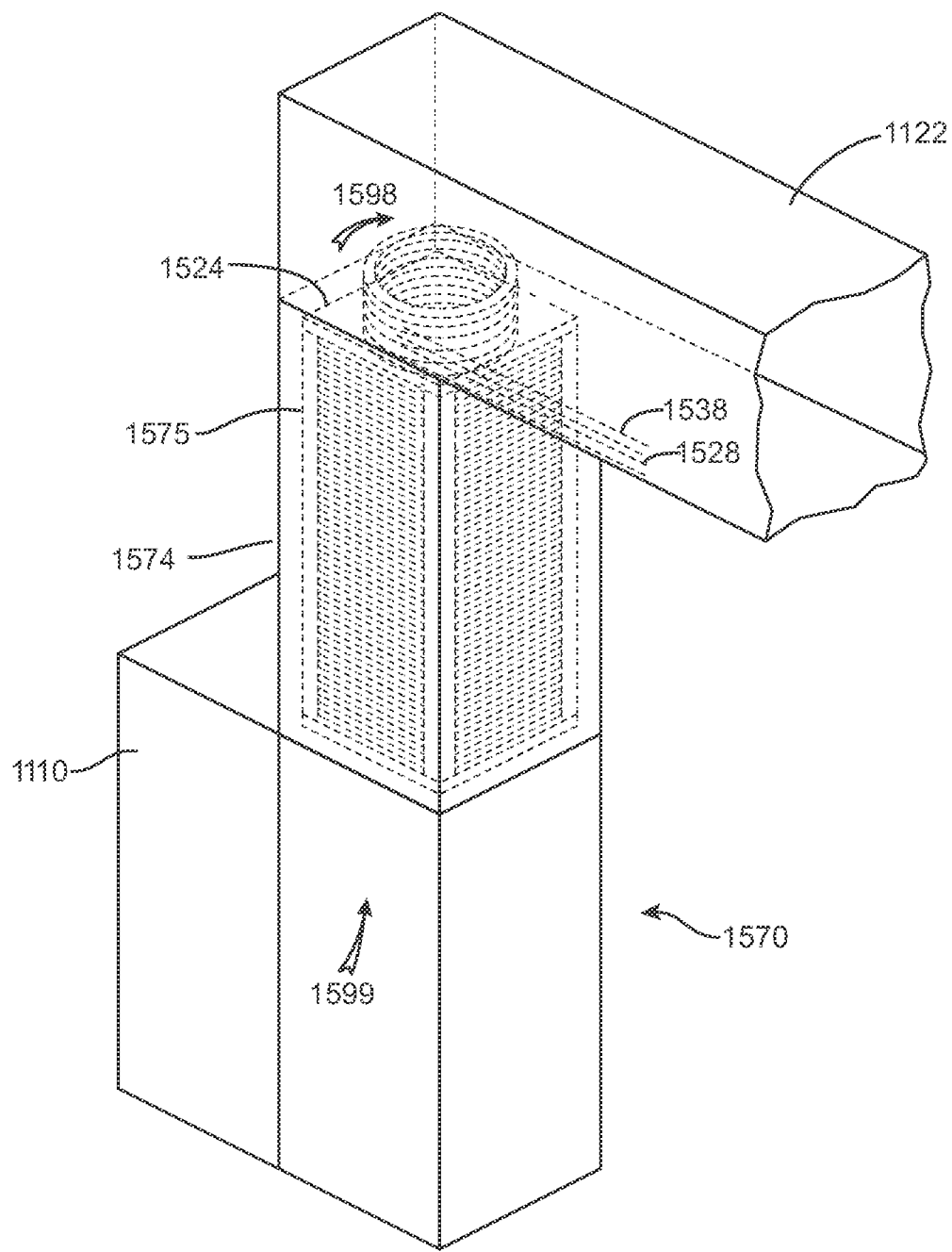
FIG. 12 is a schematic diagram of an embodiment of a heat exchanger in a data center chimney above the server rack.

For example, FIG. 12 illustrates two-phase heat exchanger 1571 located in the portion 1575 of chimney cooling system 1570. Portion 1575 is above the rack 1110. The entirety of two-phase heat exchanger 1575 is above the rack. Heated air 1599 flows to the tack of rack 1110 and upward into two-phase heat exchanger 1571 in the chimney above the rack. Cooled air 1598 flows into the return air plenum 1122 for additional processing. Outlet header 1524 is shown, as are outlet flexible connection 1538 and inlet flexible connection 1528.

FIG. 12 illustrates that a smaller two-phase heat exchanger would enable one to reduce the size the portion 1575 of the chimney above the server. This size reduction could be taken as shortening of portion 1575 and thus lowering the return air plenum 1122.

Location of the chimney heat exchanger in the chimney above the rack is advantageous in two-phase heat exchanger. As described above, having the heat exchanger in the chimney directly behind the rack as shown in FIG. 2 is advantageous in such embodiments because the air must change direction. However, in embodiments having the entirety of the chimney heat exchanger above the rack, as shown in FIG. 10 and FIG. 11, the air flow through the chimney heat exchanger will be straight. A straight flow path contributes to higher flow rates and smoother operation of a two-phase system.

Air and working fluid piping can be suspended in a ceiling plenum, suspended beneath the ceiling, or located under a raised floor. FIG. 2, FIG. 10, and FIG. 11 illustrate only a single server rack. However, embodiments of the disclosure may serve a plurality of server racks. Because racks are frequently moved into and out of datacenters, the distribution piping may be fitted with connection points, such as drip-proof connectors, valves, and other suitable connectors. In embodiments of the disclosure having multiple racks, the racks may be arranged so there may be alternating 'hot aisles' and 'cold aisles.' The hot aisles form passageways for fluid conduits, and the cold aisles have no conduits.

Examples

Example 1— The following is an example of savings that may be realized by implementation of an embodiments of the disclosure.

Moderate to high density racks typically raise the temperature of cooling air by at least about 30° F. Therefore, inlet air at 75° F. will be heated to about 105° F. If condenser water is used for cooling and condensing, if necessary, refrigerant in a waste heat air stream, the refrigerant will be no hotter than about 85° F., with a typical 10° F. approach temperature difference. Such a typical system removes as much as about ⅔ of the heat from the chimney on a typical day.

Reduction of the condenser water can result in removal of more heat from the chimney. For example, the following savings can be achieved for removal of an additional 10 kW:

| | |
|---|---|
| Additional heat removed | 10 kW, or about 3 tons |
| Cost of chiller energy | 0.6 kW per ton |
| Energy saved | About 2 kW |
| Hours operation per year | 8,760 |
| Energy saved per year | About 14,950 kWhr |
| Approximate cost of energy | $0.10 per kWhr |
| Savings per rack | $1495 |

Example 2— The following is an example of temperatures that may be expected during to operate a two-phase system. If condenser water is available in a typical system at a temperature of 45° F., about 120 gpm will be used to remove 210 kW of energy. The same 10° F. approach temperature would result in a refrigerant outlet temperature of 55° F. and a refrigerant boiling point of 64° F. Thus, a 20° F. temperature difference between condenser water temperature and refrigerant boiling point is suitable to make a system work well. A larger heat exchanger would enable a temperature difference of about 10° F., but would require a boiling point of about 95° F. to 100° F. This configuration would greatly reduce the amount of heat that can be removed on a typical day.

While various embodiments of the invention have been described, the description is intended to be exemplary, rather than limiting and it will be apparent to those of ordinary skill in the art that many more embodiments and implementations are possible that are within the scope of the invention. Accordingly, the invention is not to be restricted except in light of the attached claims and their equivalents. Also, various modifications and changes may be made within the scope of the attached claims.

We claim:

1. A cooling system configured to remove heat from a chimney of a server cabinet comprising:
the chimney having an extending portion extending above a server rack;
a chimney heat exchanger unit including a chimney heat exchanger disposed in the extending portion of the chimney above the server rack;
the chimney heat exchanger having a fluid inlet for receiving a working fluid, and a fluid outlet for discharging the working fluid;

the chimney heat exchanger also having an upstream surface receiving warm waste heat generated by one or more servers; and the chimney heat exchanger also having a downstream surface that discharges cooled air cooled by the chimney heat exchanger;

wherein the server can be accessed through the chimney without moving the chimney heat exchanger; and wherein an air handler heat exchanger further cools cooled air from the chimney and returns cold air to the server rack.

2. The cooling system according to claim 1, further comprising air handler working fluid of the air handler heat exchanger to further cool the cooled air discharged from the chimney heat exchanger.

3. The cooling system of claim 2, wherein the warmed air handler working fluid is cooled by chiller working fluid.

4. The cooling system of claim 3, wherein the warmed chiller working fluid is cooled in a second heat exchanger.

5. The cooling system of claim 1, wherein the second heat exchanger cools the working fluid.

6. The cooling system of claim 4, wherein the chiller working fluid is combined with the chimney heat exchanger fluid before cooling.

7. The cooler system of claim 6, wherein a portion of the cooled working fluid is returned to the chiller and the remainder is returned to the chimney heat exchanger.

8. The cooler system of claim 1, wherein the working fluid in the chimney heat exchanger is concurrent with the flow of the waste heat flow.

9. A cooling system configured to remove heat from a chimney of a server rack, wherein;

the chimney has an upper portion that extends upward from the top of the server rack;

a chimney heat exchanger is disposed within the upper portion;

the chimney heat exchanger has a fluid inlet for receiving a working fluid, and a fluid outlet for discharging the working fluid;

the chimney heat exchanger also has an upstream surface receiving warm waste heat generated by one or more servers; and the chimney heat exchanger also had a downstream surface that discharges cooled air cooled by the chimney heat exchanger;

wherein the server can be accessed through the chimney without moving the chimney heat exchanger; and wherein an air handler heat exchanger further cools cooled air from chimney and returns cold air to the server rack.

10. The cooling system of claim 9, further comprising a second fluid heat exchanger in thermal communication with a cooling tower in a second heat exchanger circuit.

11. The cooling system of claim 10, wherein the working fluid is passively conveyed from the second fluid heat exchanger in the second heat exchanger circuit to the chimney heat exchanger.

12. The cooling system of claim 9, wherein the working fluid at least partially changes phase in the chimney heat exchanger.

13. The cooling system of claim 12, wherein the second heat exchanger in the second heat exchanger circuit cools warm chimney heat exchanger working fluid.

14. The cooling system of claim 9, wherein the air handler heat exchanger is connected to the chimney heat exchanger by a return air plenum configured to conduct the cooled air from chimney and an air supply conduit configured to conduct the cold air to the server rack.

15. The cooling system of claim 9, wherein a chiller cools air handler heat exchanger working fluid.

16. The cooling system of claim 15, wherein the chiller is in thermal communication with an air handler cooling tower.

17. The cooler system of claim 9, wherein the working fluid in the chimney heat exchanger is concurrent with the flow of the waste heat flow.

18. The cooler system of claim 9, further comprising a fluid level controller.

19. The cooler system of claim 12, further comprising a fluid level controller.

20. The cooler system of claim 19, wherein a fraction of heat removed by phase change is at least about 10 percent of the total heat transfer.

* * * * *